US007002294B2

(12) United States Patent
Forrest et al.

(10) Patent No.: US 7,002,294 B2
(45) Date of Patent: Feb. 21, 2006

(54) METHOD OF PROTECTING ORGANIC OPTOELECTRONIC DEVICES

(75) Inventors: Stephen Forrest, Princeton, NJ (US); Paul Burrows, Kennewick, WA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/863,182

(22) Filed: Jun. 8, 2004

(65) Prior Publication Data

US 2004/0242116 A1 Dec. 2, 2004

Related U.S. Application Data

(62) Division of application No. 10/028,465, filed on Dec. 20, 2001, now Pat. No. 6,765,351.

(51) Int. Cl.
*H05B 33/04* (2006.01)

(52) U.S. Cl. .................. 313/506; 313/504; 445/25; 445/58

(58) Field of Classification Search ........ 313/498–512; 315/169.3; 428/690, 917; 257/40; 445/25, 445/58

See application file for complete search history.

(56) References Cited

U.S. PATENT DOCUMENTS

| 4,842,893 | A | 6/1989 | Yializis et al. ............... 427/44 |
| 4,954,371 | A | 9/1990 | Yializis ........................ 427/44 |
| 5,260,095 | A | 11/1993 | Affinito ..................... 427/124 |
| 5,707,745 | A | 1/1998 | Forrest et al. ............... 428/432 |
| 5,757,126 | A | 5/1998 | Harvey, III et al. ......... 313/506 |
| 5,952,778 | A | 9/1999 | Haskal et al. ............... 313/504 |
| 5,998,803 | A | 12/1999 | Forrest et al. ............... 257/40 |
| 6,046,543 | A | 4/2000 | Bulovic et al. ............. 313/504 |
| 6,146,225 | A | 11/2000 | Sheats et al. ................ 445/24 |
| 6,150,043 | A | 11/2000 | Thompson et al. ......... 428/690 |
| 6,198,220 | B1 | 3/2001 | Jones et al. ................. 313/512 |

(Continued)

FOREIGN PATENT DOCUMENTS

| EP | 0 977 469 A2 | 2/2000 |
| WO | WO 99/20081 | 4/1999 |

(Continued)

*Primary Examiner*—Karabi Guharay
(74) *Attorney, Agent, or Firm*—Mayer & Williams PC; David B. Bonham, Esq.

(57) ABSTRACT

The present invention is directed to an organic optoelectronic device, such as an OLED device, provided with a vacuum deposited conformal composite coating for protecting the device from environmental elements such as moisture and oxygen. The present invention is also directed to a method for vacuum depositing a conformal composite coating directly onto an organic optoelectronic device, such as an OLED device, on a substrate. According to one embodiment, the invention provides a protected OLED device comprising a substrate; an active region positioned on said substrate; a first protective layer disposed over the active region; and a second protective layer disposed over the first protective layer, wherein said second protective layer comprises multiple sub-layers that further comprise an alternating series of two or more first polymeric sub-layers and two or more first high density sub-layers.

15 Claims, 6 Drawing Sheets

U.S. PATENT DOCUMENTS

| | | | |
|---|---|---|---|
| 6,207,559 B1 * | 3/2001 | Jiang | 438/653 |
| 6,224,948 B1 | 5/2001 | Affinito | 427/488 |
| 6,268,695 B1 | 7/2001 | Affinito | 313/504 |
| 6,522,067 B1 | 2/2003 | Graff et al. | 313/512 |
| 6,576,351 B1 | 6/2003 | Silvernail | 428/690 |
| 6,597,111 B1 | 7/2003 | Silvernail et al. | 313/506 |
| 2002/0113548 A1 | 8/2002 | Silvernail | 313/506 |
| 2002/0125822 A1 | 9/2002 | Graff et al. | 313/506 |
| 2003/0085652 A1 | 5/2003 | Weaver | 313/506 |
| 2003/0117066 A1 | 6/2003 | Silvernail | 313/506 |

FOREIGN PATENT DOCUMENTS

| | | |
|---|---|---|
| WO | WO 00/26973 | 5/2000 |
| WO | WO 00/36665 | 6/2000 |

\* cited by examiner

METHOD OF PROTECTING ORGANIC OPTOELECTRONIC DEVICES

This is a divisional application of U.S. patent application Ser. No. 10/028,465, filed Dec. 20, 2001, now U.S. Pat. No. 6,765,351, entitled "Organic Optoelectronic Device Structures," which is incorporated by reference herein in its entirety.

The U.S. Government has a paid-up license in this invention and the right in limited circumstances to require the patent owner to license others on reasonable terms as provided for by the terms of Contract No F33615-94-1-1414 awarded by the Defense Advanced Research Projects Agency.

FIELD OF THE INVENTION

The present invention relates to organic optoelectronic devices, such as organic light emitting devices, organic photovoltaic devices and organic thin film transistors, that are protected from species in the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

Figure 1A:
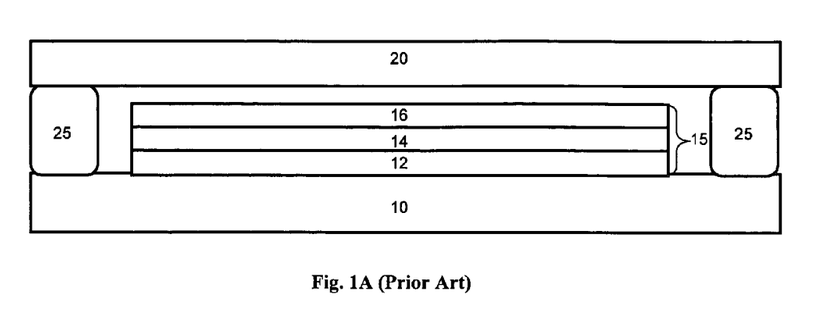
FIGS. 1A and 1B are simplified schematic representations (cross-sectional views) of prototype organic structures, and-in particular OLED structures.
Figure 1B:
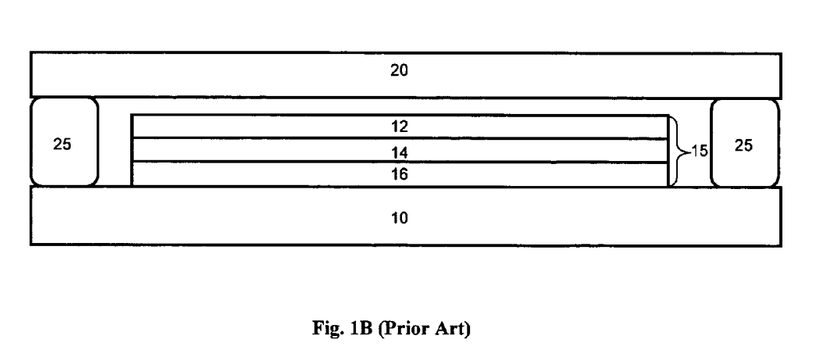

In general, two-dimensional OLED arrays for imaging applications are known in the art and typically include an OLED display area that contains a plurality of active regions or pixels arranged in rows and columns. FIG. 1A is a simplified schematic representation (cross-sectional view) of an OLED structure of the prior art. The OLED structure shown includes a single active region 15 which includes an electrode region such as anode region 12, a light emitting region 14 over the anode region 12, and another electrode region such as cathode region 16 over the light emitting region 14. The active region 15 is disposed on a substrate 10. With the aid of a sealing region 25, the cover 20 and the substrate 10 cooperate to restrict transmission of oxygen and water vapor from an outer environment to the active pixel 15. Traditionally, light from the light emitting layer 14 was transmitted downward through the substrate 10. However, other OLED architectures are also known in the art, including "top-emitting" OLEDs and transparent OLEDs (or "TOLEDs"). Moreover, structures are also known in which the positions of the anode 12 and cathode 16 in FIG. 1A are switched as illustrated in FIG. 1B. Such devices are sometimes referred to as "inverted OLEDs".

Unfortunately, certain OLED structure components, such as reactive metal cathode components, are susceptible to oxygen and moisture, which exist in the ambient atmosphere and can produce deleterious effects that can severely limit the lifetime of the devices. For example, moisture and oxygen are known to increase "dark spot areas" in connection with OLED structures. The organic materials utilized in a conventional OLED structure can also be adversely affected by environmental species such as water and oxygen. Components of various other organic optoelectronic devices such as organic electrochromic displays, organic photovoltaic devices and organic thin film transistors are likewise susceptible to attack from exterior environmental species including water and oxygen.

One approach to mitigating the adverse affect of moisture and oxygen is to attach a cover to the substrate, for example, with the aid of sealing region 25 as shown in FIGS. 1A and 1B. The attachment of the cover is typically done under a clean, dry, inert atmosphere, and employs adhesives such as epoxy resins that can be deleterious to the OLED device. Moreover, epoxy resins suitable for sealing a cover to an OLED substrate are generally not flexible. Therefore, the use of epoxy resins is undesirable particularly where a flexible OLED (FOLED) is desired. These additional processing steps are time consuming and complex, decreasing the production efficiency and increasing the expense associated with manufacturing OLEDS.

It has also been proposed, for example, in U.S. Pat. Nos. 6,146,225 and 6,268,695, both of which are incorporated herein in their entireties, to form a multi-layer coating (also referred to herein as a composite barrier layer) directly onto an OLED device by use of a polymer multilayer process (or "PML" process). The PML process is disclosed, for example, in U.S. Pat. Nos. 4,842,893, 4,954,371, and 5,260,095 and 6,224,948, all of which are incorporated herein in their entireties. The PML process is advantageous because it is a vacuum compatible process which produces a conformal coating that does not require the separate attachment of a preformed multi-layer cover, as discussed above. Moreover, the PML process produces a composite barrier layer with good resistance to moisture and oxygen penetration.

However, when used to directly deposit a composite barrier layer on an OLED device, the PML process itself can cause damage to the active region of the OLED. For example, the PML process commonly involves the use of acrylic monomers that are polymerized in situ on a substrate by ultraviolet radiation and heat. It is believed that when the PML process is employed to form a multi-layer protective layer on an OLED, diffusion or seepage of the acrylic monomer into the layers in the active region of the OLED, i.e., the cathode layer, light emitting layer(s) and anode layer, causes damage thereto. Moreover, the heat employed during the PML process may also cause damage to one or more of the layers in the active region of the OLED. Damage to the OLED is manifested in, for example, reduced optoelectronic performance characteristics such as brightness, operating voltage, and light emission efficiency as is known in the art.

SUMMARY OF THE INVENTION

In accordance with the foregoing, it would be desirable to provide an organic device, such as an OLED, organic electrochromic display, organic photovoltaic device or organic thin film transistor, that is protected from oxygen and moisture through the use of a composite barrier layer that provides a conformal coating for the device fabricated on a substrate. It would further be desirable to provide a structure and process for such an organic device, wherein damage to the device that is ordinarily caused by the direct application of a composite barrier layer onto the organic device is reduced or eliminated. The above and other challenges are addressed by the present invention.

According to an embodiment of the present invention, there is provided a protected organic device comprising (a) a substrate; (b) an active region positioned on the substrate; (c) a first protective layer disposed over the active region; and (d) a second protective layer disposed over the first protective layer, wherein the second protective layer comprises an alternating series of two or more first polymeric sub-layers and two or more first high density sub-layers. In a preferred embodiment, the organic optoelectronic device comprises an OLED wherein the active region comprises an anode layer, a cathode layer and a light-emitting layer disposed between the anode layer and the cathode layer In another aspect, the present invention is directed to a method for providing such a protected organic optoelectronic device, wherein the method comprises vacuum depositing a conformal composite coating directly onto an organic optoelectronic device, such as an OLED, constructed on a substrate.

In some preferred embodiments of the present invention, the first protective layer is a material selected from the group consisting of organometallic materials, inorganic materials and polymeric materials. In a particularly preferred embodiment of the present invention, the first protective layer is an organometallic material such as a phthalocyanine or a porphyrin. Metal phthalocyanines, such as copper phthalocyanine, are especially preferred.

In some preferred embodiments, the first protective layer is disposed over the active region, contacting the cathode. In other preferred embodiments, the first protective layer is disposed over the active region, contacting the anode.

In other preferred embodiments, one of the polymeric sub-layers is disposed over and contacting the first protective layer. Polyacrylates are among preferred polymeric sub-layers. In particularly preferred embodiments of the present invention, the polyacrylates are vacuum deposited over a first protective layer comprising an organometallic material.

These and other embodiments and advantages of the present invention will become readily apparent to those of ordinary skill in the art upon review of the disclosure to follow.

BRIEF DESCRIPTION OF THE DRAWINGS

As is typically the case with such figures, the above are simplified schematic representations presented for purposes of illustration only, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a the cathode layer illustrated in FIG. 2.

Figure 2:
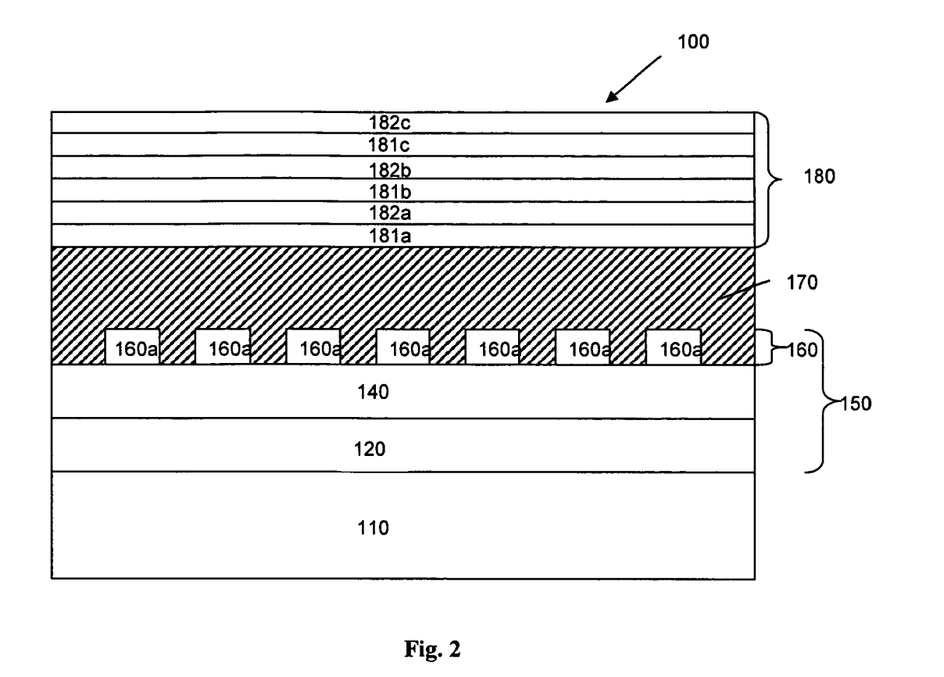
FIG. 2 is a simplified schematic representation (cross-sectional view) of a protected OLED structure in accordance with an embodiment of the present invention.

FIG. 2 is a simplified schematic representation (cross-sectional view) of an OLED structure 100 in accordance with an embodiment of the present invention. The OLED structure 100 includes substrate 110, anode layer 120, cathode layer 160 comprising multiple cathode regions 160a–e, light-emitting layer 140 positioned between anode layer 120 and cathode layer 160, first protective layer 170 disposed over cathode layer 160 and second protective layer 180 disposed over first protective layer 170. The anode layer 120, light emitting layer 140 and cathode layer 160 are, collectively, referred to herein as the "active region" 150.

While the invention is exemplified in reference to OLED structure 100, it is understood that the first protective layer described below can equally well be disposed over an active region of any organic optoelectronic device, including organic electrochromic displays, organic photovoltaic devices and organic thin film transistors, prior to application of the second protective layer. Thus, the invention disclosed herein has broad applicability to organic optoelectronic devices including, but not limited to, organic light emitting diodes, organic electrochromic displays, organic photovoltaic devices and organic thin film transistors.

In preferred embodiments of the invention, such as depicted in FIG. 2, the anode layer 120 is positioned on the substrate 110 and the first protective layer 170 is disposed over the active region, contacting the cathode layer 160. However, the positions of the anode and cathode layers may be reversed. In such an inverted configuration, the cathode layer is positioned on the substrate and the first protective layer is disposed over the active region, contacting the anode layer.

FIG. 2 depicts the cathode layer 160 as a patterned layer as hereinabove described comprising multiple cathode regions 160a–e and the first protective layer extending downwardly between multiple cathode regions 160a–e and contacting the light-emitting layer 140. However, it is understood that the cathode layer may comprise any layer structure as described herein including a continuous layer, in which case, the first protective layer 170 will not necessarily extend downwardly between any individual cathode regions. A continuous cathode layer need not completely cover the light emitting layer 140. In such an embodiment, the first protective layer 170 may contact the top surfaces of the cathode and extend laterally downwardly therefrom and contact the light emitting layer 140 and/or substrate 110.

The substrate 110 is typically selected to, among other things, restrict transmission of oxygen and water from the outside environment to the active region. Depending on the application, the substrate 110 can be opaque or transparent. For traditional bottom-emitting OLED structures, the substrate 110 will be transparent, at least in part. For top-emitting OLED structures, the substrate 110 can be opaque, while the first protective layer 170 and second protective layer 180, will be transparent, at least in part. For TOLED structures, the substrate 110, first protective layer 170 and second protective layer 180 will be transparent, at least in part. Depending on the particular OLED configuration, at least one of the anode layer and cathode layer will be transparent, at least in part.

The materials selected for the substrate 110 will depend upon the application at hand. Metals offer excellent barrier properties, and can be provided in a number of configurations as a cover for the OLED displays, such as in the form of metal cans and foils. Preferred metals include aluminum, gold, nickel, nickel alloys, titanium, titanium alloys and indium, as well as other metals and metal alloys known in the art.

Semiconductors such as silicon offer good barrier properties to water, oxygen and other harmful species and also provide a substrate upon which electronic circuitry can be built.

Ceramics also offer low permeability and provide transparency in some cases. Preferred ceramics are glasses, more preferably soda lime and borosilicate glasses.

Polymers are often preferred where optical transparency is desired or where ease of continuous manufacture (e.g., web-based manufacture) is desired. Polymers are particularly preferred substrate materials for flexible OLEDS (or "FOLEDS"). As the name suggests, these structures are flexible in nature.

Preferred low permeability polymers include polyesters, polyethersulphones, polyimides and fluorocarbons. Preferred polyesters include polyethylene terephthalate. Preferred fluorocarbon polymers include Aclar® fluoropolymer available from Honeywell. Where the substrate is polymeric material, it typically ranges from 75 to 625 microns in thickness.

Composite barrier layers are also among those materials preferred for use in connection with the substrate 110. Composite materials are also advantageous, for example, in that they are flexible rendering them useful for FOLED constructions. Composite barrier layers that include both sub-layers of polymeric material and sub-layers of high-density material are discussed below in connection with the second protective layer 180. Where used as the substrate 110, such composite barrier layers are typically deposited on a polymer substrate, as discussed, for example, in U.S. Pat. No. 5,757,126.

The first protective layer 170 may be any material that can be deposited directly onto the active region without causing damage thereto. Such materials are typically insoluble materials selected from the group consisting of organometallic materials, inorganic materials, and polymeric materials. The organometallic materials useful for the first protective layer include, but are not limited to, phthalocyanines and porphyrins. Copper phthalocyanine is a particularly preferred organometallic material useful for the first protective layer. The inorganic materials useful for the first protective layer include, but are not limited to, metals, metal oxides, metal nitrides, metal carbides and metal oxynitrides. Included among such inorganic materials are silicon, silicon oxides ($SiO_x$), silicon nitrides (e.g., SiN), silicon carbides (e.g. SiC), silicon oxynitrides (e.g., SiON), indium oxides (e.g., $In_2O_3$), indium tin oxides (ITO, e.g., $In_2O_3+SnO_2$), zinc indium tin oxides (e.g., Zn+ITO), tin oxides (e.g., $SnO_2$), aluminum oxides (e.g., $Al_2O_3$), aluminum nitrides (e.g., AlN), and titanium oxides (e.g., titania, $TiO_2$). Indium tin oxide, silicon dioxide and silicon oxynitrides are particularly preferred inorganic materials use for the first protective layer. Polymeric materials useful for forming the first protective layer include, but are not limited to, perylenes such as 3,4,9,10-perylenetetracarboxylic dianhydride, parylenes, fluorinated polymers such as polytetrafluoroethylene, and poly(phenylene vinylenes).

The first protective layer 170 shown in FIG. 2 is disposed over the active region and contacts the cathode layer 160 of the active region. However, in an inverted configuration in which the positions of anode layer 120 and cathode layer 160 are inverted, the first protective layer will be disposed over the active region and contacting the anode layer of the active region. While the first protective layer is shown in FIG. 2 as extending only to the lateral edges of OLED structure 100, it is understood that the first protective layer may also be disposed on the downwardly extending lateral surfaces of the active region 150, extending, for example to the top surface of the substrate 110, or even to a bottom surface of the substrate 110.

In some embodiments, the first protective layer may also be disposed between the top surface of the substrate and the first layer of the active region which, as discussed above, may be either an anode layer or a cathode layer, depending on the OLED configuration. However, in all embodiments of the present invention, the first protective layer is at least disposed adjacent the active region between the active region and the second protective layer.

The first protective layer may be applied by any techniques known in the art and adaptable for use with the material chosen for the first protective layer. Such methods include, but are not limited to, dipping, spin coating, sputter deposition, thermal deposition, evaporative coating, spraying, flash evaporation, chemical vapor deposition, in situ polymerization of a monomer coating, and so forth. Vacuum-based techniques are preferred.

The second protective layer will now be described. Again referring to FIG. 2, the second protective layer 180 is disposed on the first protective layer 170. It is believed that the first protective layer 170 protects the underlying layers of the active region 150 from damage caused by direct application of the second protective layer 180 onto the OLED device, e.g., by a PML process. The first protective layer 170 may also provide additional protection against penetration of harmful environmental species to the active region 150.

The second protective layer 180 is a composite barrier layer that includes a plurality of cooperative barrier sub-layers that include both sub-layers of polymeric material 181a–c and sub-layers of high-density material 182a–c. Examples of such composite barrier layers are disclosed in Published International Application Nos. WO 00/36665 and WO 00/26973 and U.S. Pat. No. 6,268,695 B1, each of which is incorporated herein in its entirety by reference. These cooperative barrier sub-layers are preferably provided in an alternating configuration. Preferably, 1 to 10 pairs of these sub-layers, more preferably 3 to 7 pairs, are used. Thus, although three alternating pairs are illustrated in FIG. 2, other sub-layer arrangements are possible.

The cooperative barrier sub-layers 181a–c and 182a–c are disposed on the first protective layer 170 that is, in turn, disposed on cathode layer 160 in the embodiment shown. While the second protective layer is shown in FIG. 2 as extending only to the lateral edges of OLED structure 100, it is understood that the second protective layer may also be disposed on the downwardly extending lateral surfaces of the active region into contact with any exposed top surface of the substrate. The second protective layer may also be disposed on the bottom surfaces of the OLED structure. The second protective layer can, therefore, be provided so as to completely cover all exposed surfaces of the OLED device, in which case the OLED device will be encapsulated by the second protective layer. In some preferred embodiments of the present invention, particularly those embodiments in which the substrate is a flexible polymer (FOLEDs) and hence permeable to moisture and oxygen, it may be preferable to completely cover all exposed surfaces with the second protective layer. Where the substrate is an impermeable material such as glass it may be less expedient to cover the bottom surfaces of the substrate with the second protective layer.

The second protective layer may also extend between the top surface of the substrate and the first layer of the active region which, as discussed above, may be either an anode layer or a cathode layer, depending on the OLED configuration. Where the first protective layer is also disposed between the top surface of the substrate and the active region, the first protective layer will typically be disposed between the second protective layer and the first layer of the active region.

Figure 3:
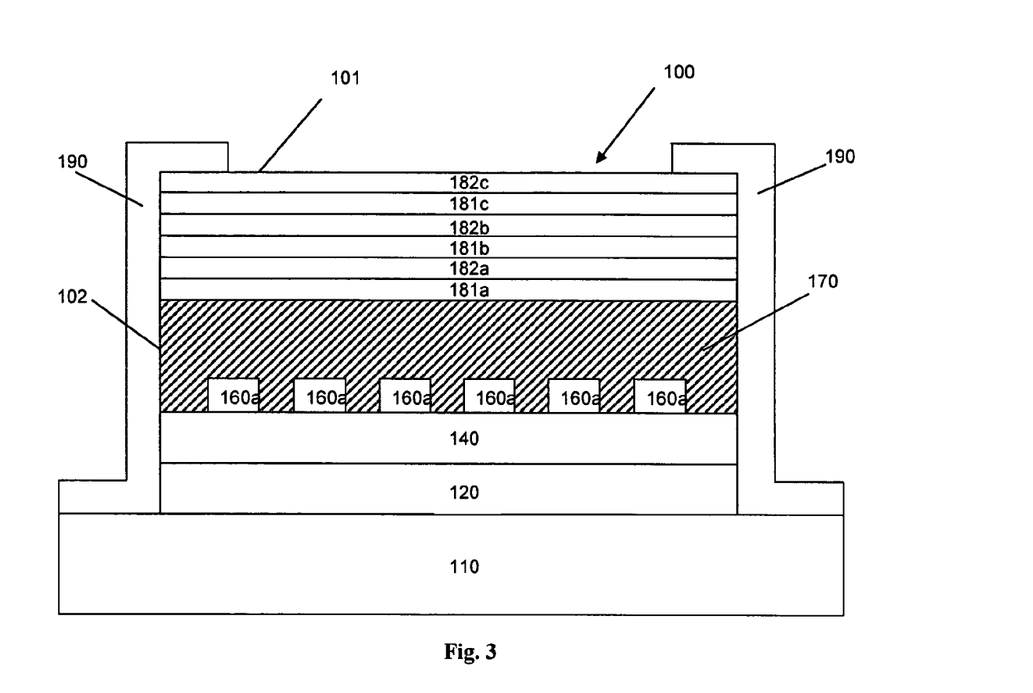
FIG. 3. is a simplified schematic representation (cross-sectional view) of a protected OLED structure provided with protective end caps in accordance with an embodiment of the present invention.

In some embodiments, it may be desirable to provide an organic optoelectronic device in accordance with the present invention with additional protection from ingression of contaminants through the lateral surfaces or edges of the device. In these embodiments, the device may be provided with end caps comprised of any high density material (such as $SiO_2$) or metallic material described herein. The end caps may be disposed so as to extend from a top surface of the device, downwardly along the lateral edges of the device, and into contact with the substrate or any protective layer disposed on the substrate. FIG. 3 shows an OLED device 100 in accordance with the present invention provided with end caps 190 that provide additional protection from the ingress of contaminants through the edges of the device. OLED device 100 shown in FIG. 3 has substantially the same structure as OLED device 100 depicted in FIG. 2. End caps 190 shown in FIG. 3 extend from top surface 101 of device 100, downwardly along the lateral edges 102 of device, and into contact with substrate 110. End caps 190 can be formed from, for example, metal or ceramic (e.g., silicon dioxide).

In some embodiments, the first protective layer can function as the substrate upon which the OLED device is constructed.

Preferred polymeric materials for use in the composite barrier layer include polymers such as fluorinated polymers, parylenes, cyclotenes and polyacrylates. Sub-layers of such polymeric materials 181a–c can be provided using techniques known in the art, for example, by dipping, spin coating, sputtering, evaporative coating, spraying, flash evaporation, chemical vapor deposition and so forth.

In some preferred embodiments, the polymeric material is a polyacrylate that forms the first sub-layer of the composite barrier layer. This polyacrylate sub-layer is disposed over and preferably contacts the first protective layer that, as discussed above, is disposed over and contacts the active region. The polyacrylate layer may be formed, for example, on the first protective layer by vacuum deposition of a liquid acrylic monomer directly onto the first protective layer. The acrylic monomer is then polymerized or cross-linked by, for example, exposure to heat or to a radiation source such as a UV lamp. Among acrylic monomers useful for forming the polyacrylate layer are included, but not limited to, tripropyleneglycol diacrylate, tetraethylene glycol diacrylate, tripropylene glycol monoacrylate, caprolactone acrylate, and combinations thereof; methacrylic monomers; and combinations thereof. In some preferred embodiments where the polymeric material forming the first sub-layer of the composite barrier layer is a polyacrylate, the first protective layer is preferably an organometallic material such as copper phthalocyanine.

By "high-density material" is meant a material with sufficiently close atomic spacing such that diffusion of contaminant and deleterious species, particularly water and oxygen, are hindered. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Sub-layers of high-density material 182a–c can be applied using techniques known in the art such as thermal evaporation, sputtering, PECVD methods and electron-beam techniques.

One preferred method of applying the composite barrier layer to the device is the PML process such as disclosed in, e.g., U.S. Pat. Nos. 4,842,893, 4,954,371, 5,260,095 and 6,224,948, each of which is incorporated by reference herein in its entirety. Other adaptations of the PML process are known in the art and may, without limitation, be used herein to form the composite barrier layer. When used to form a composite barrier layer for an OLED, the PML process typically involves sequential deposition of a polymeric material followed by a deposition of a high density material onto the polymeric material. The deposition of a polymeric material such as a polyacrylate is described hereinabove. The high density material is typically vacuum deposited after curing of the acrylic monomer.

Examples of composite barrier layers comprising sub-layers of both high-density material and polymeric material formed on a polymer substrate sub-layer are disclosed, for example, in U.S. Pat. No. 5,757,126, the entire disclosure of which is hereby incorporated by reference.

It is preferred that in a protected OLED device of the present invention, the first protective layer will comprise a first material disposed over and preferably contacting the active region and the second protective layer will comprise a composite barrier layer disposed over and preferably contacting the first protective layer. The second protective layer comprises multiple sub-layers comprising an alternating series of two or more first polymeric sub-layers and two or more first high density sub-layers, wherein the multiple sub-layers comprise at least one sub-layer of a second material and at least one sub-layer of a third material, and wherein said first, second and third materials differ from one other. A first sub-layer of the second protective layer will be disposed over and preferably contacting the first protective layer. A second sub-layer of the second protective layer will be disposed over and preferably contacting the first sub-layer. In preferred embodiments, the first protective layer, first sub-layer and second sub-layer will comprise different materials Preferably, the first sub-layer will be a polymeric layer and the first protective layer will be an organometallic material such as copper phthalocyanine.

The active region 150 of the OLED can be configured in any manner known in the art. The active region of the OLED can comprise one or many active pixels, each of which typically comprises an anode layer, a cathode layer, and a light-emitting layer (emission layer) disposed between the anode and cathode layer.

Depending on the application, the anode layer 120 may be transparent or opaque. Opaque anode materials include metals such as gold, chromium and magnesium/silver, while transparent anode materials include metal oxides such as indium tin oxide (ITO) and zinc tin oxide. Similarly, the cathode layer 160 can be transparent or opaque depending on the application. Opaque cathode materials may include metals such as aluminum and aluminum/lithium or other materials is known in the art, while transparent cathode materials may include metal/metal oxide combinations such as Mg—Ag/ITO or other materials known in the art.

The light emitting layer 140 can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

The OLED structure 100 can also include getter protection as is known in the art. The getter regions can be formed from any getter material that reacts readily with active gases (including water and oxygen), forming stable low-vapor-pressure chemical compounds so as to remove the active gases from the gas phase. The getter region(s) provide an additional measure of protection in the event that reactive gases such as water and oxygen penetrate to the active region through the first and/or second protective layers. In such event, the material of the getter region reacts with and/or neutralizes the reactive gases or water before such species can cause harm to the active region of the OLED. For example, with reference to FIG. 2, a getter region can be provided as a dessicant layer between first protective layer 170 and second protective layer 180 to provide additional protection against penetration of water into active region 150.

EXAMPLE

A specific embodiment of the present invention will now be described. It is understood that the present invention is not to be construed as limited to the specific embodiment described in this Example, which is provided only for purposes of better illustrating the present invention.

An OLED device having an active region was constructed on an ITO-coated substrate which had been cleaned with standard detergent (trichloroethylene, acetone/methanol) and exposed to ultraviolet light in the presence of ozone for 2 minutes. The active region comprised, in sequence, 200 Å CuPc, 500 521 α-NPD (4,4'-bis[N-(1-napthyl)-N-phenyl-amino]biphenyl), 350 Å Alq$_3$ (aluminum tris (8-hydroxyquinolate)) doped with 0.08% by weight DMQA (dimethylquinacridone), 200 Å Alq$_3$ and 1500 Å MgAg.

Two groups of four of the above devices were provided with no protective coating layers. One of these groups was a control group and was stored in a dry nitrogen glove box. The other was a witness group which was shipped with the devices described below and loaded into the PML deposition, but not encapsulated.

A group of four of the above OLED devices (comparative group) was shipped under nitrogen to a facility where a composite (PML) barrier layer was deposited on the cathode but no other protective layer. The composite (PML) barrier layer in the comparative sample comprised a layer structure such as described in U.S. Pat. No. 6,268,695 B1 which is incorporated herein in its entirety by reference. Finally, a group of four of the foregoing OLED devices was shipped under nitrogen to a facility where each was provided with a copper phthalocyanine (CuPc) layer of 2000 Å thickness using vacuum deposition, which was disposed on the cathode, followed by deposition of the above composite (PML) barrier layer on the CuPc layer.

Figure 4:
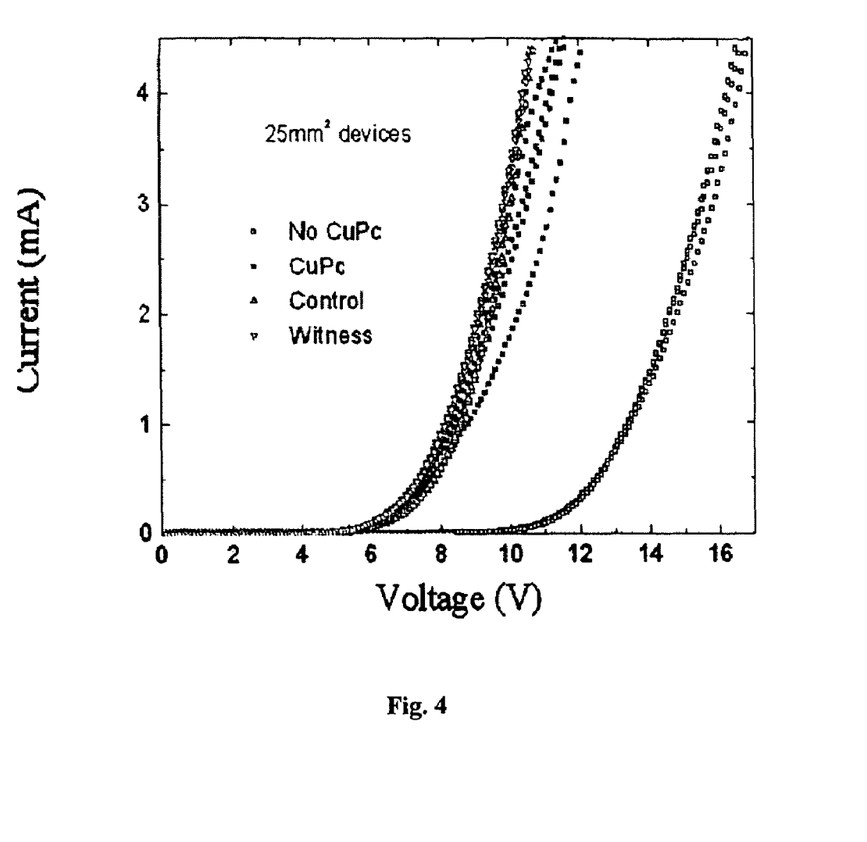
FIG. 4 is a graph depicting the current-voltage characteristics of an OLED constructed in accordance with an embodiment of the present invention.
Figure 5:
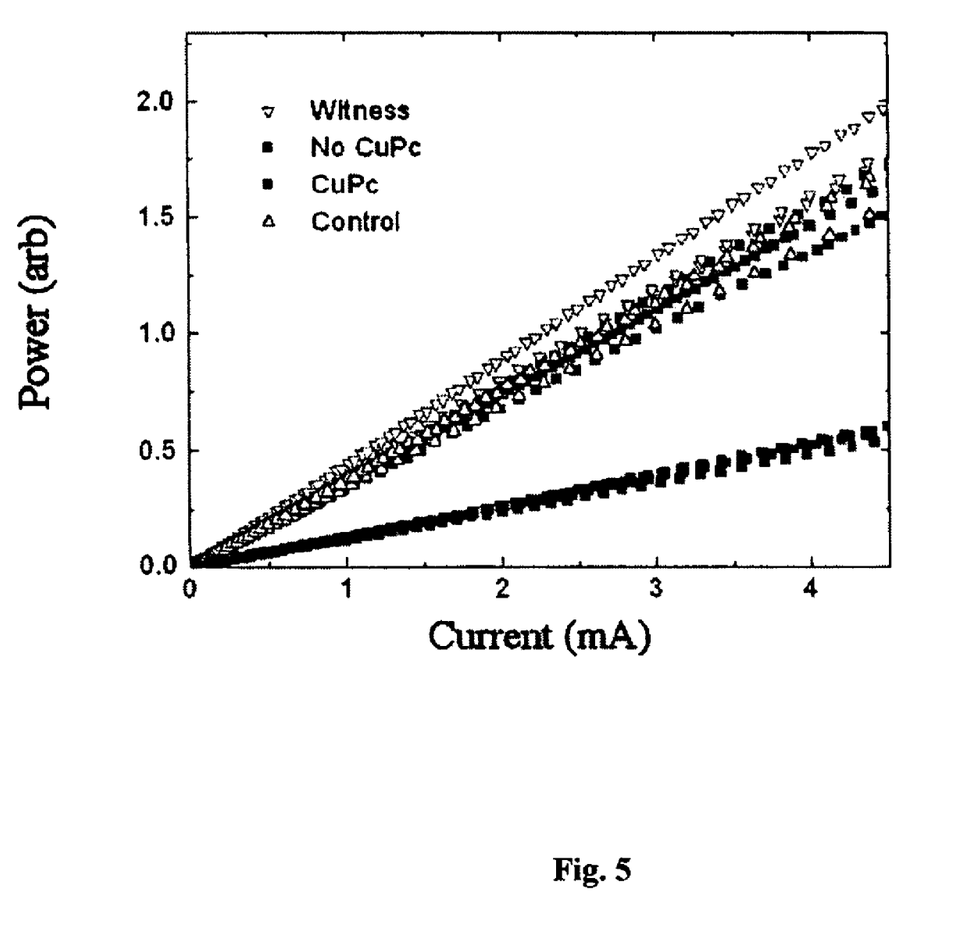
FIG. 5 is a graph depicting the power-current characteristics of an OLED constructed in accordance with an embodiment of the present invention.

FIGS. 4 and 5 are graphs showing the opto-electronic performance characteristics of the control, comparative and witness samples as compared with those of an OLED device in accordance with the present invention having both a first protective CuPc layer and a second protective composite barrier layer. The control and witness groups having no protective layers were left under a nitrogen atmosphere for tested. The comparative group and the group according to the present invention were tested using conditions known in the art.

FIG. 4 shows the current vs. voltage (I–V) characteristics of the control, comparative and witness samples as compared to the I–V characteristics of a protected OLED device in accordance with the present invention. FIG. 4 shows that deposition of a composite barrier layer (PML) directly onto a device that does not have a CuPc protective layer, as in the comparative sample, significantly increases the drive voltage, suggesting that the structure has been damaged. The presence of a CuPc protective layer dramatically decreases the degree of damage.

Similarly, FIG. 5 shows the power vs. current characteristics of the control, comparative and witness samples as compared to the power vs. current characteristics of a protected OLED device in accordance with the present invention. Again, applying a composite barrier layer (PML) directly onto a device that does not have a CuPc protective layer, as in the comparative sample, decreases the efficiency of the device, suggesting that the structure has been damaged.

Figure 6:
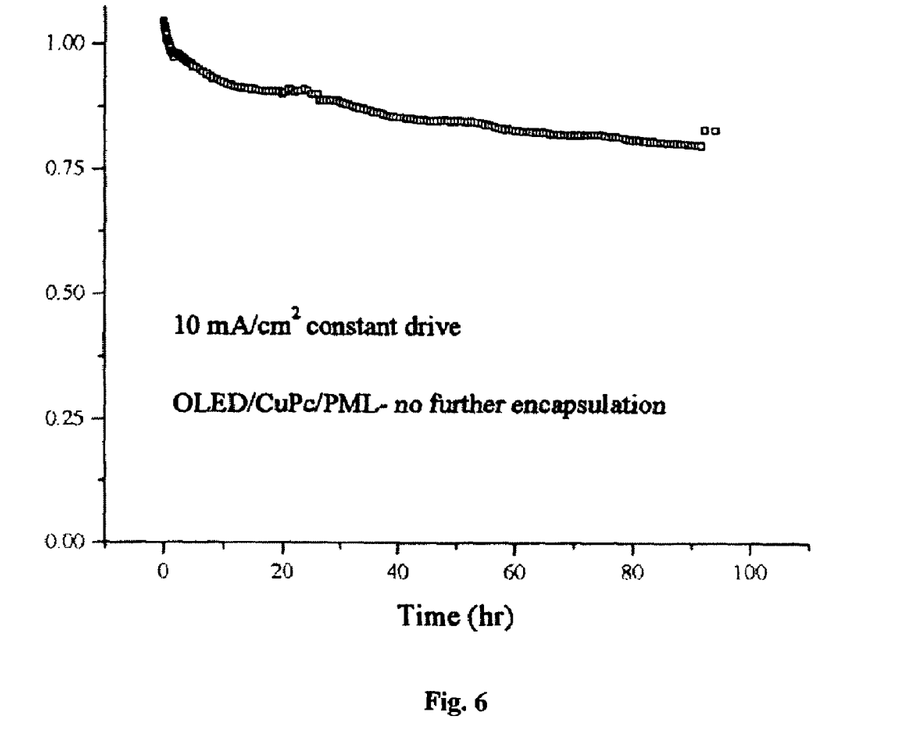
FIG. 6. is a graph depicting the opto-electronic performance characteristics of an OLED constructed in accordance with an embodiment of the present invention.

The protected OLED devices of the present invention, having both a first protective layer disposed over the OLED active region and a second protective composite barrier layer disposed over the first protective layer thus demonstrate improved opto-electronic performance characteristics relative to OLED devices in which a composite barrier layer is deposited directly, e.g., by a PML process, onto an active region of the OLED. Moreover, the protected OLED devices of the present invention, without further encapsulation, demonstrate extended lifetime relative to unprotected OLEDs. Thus, as shown in FIG. 6, an OLED device constructed in accordance with an embodiment of the present invention, having a copper phthalocyanine first protective layer and a composite barrier layer deposited thereon, provides substantially constant performance characteristics over the lifetime of the device.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. A method for protecting an OLED device comprising:
   (a) providing an OLED device on a substrate, said OLED device having an active region, said active region comprising an anode layer, a cathode layer, and a light-emitting layer disposed between the anode layer and the cathode layer;
   (b) depositing a first protective layer of a first material over the active region, said first material comprising an organometallic material;
   (c) depositing a second protective layer over the first protective layer, the second protective layer comprising multiple sub-layers that further comprise an alternating series of two or more first polymeric sub-layers and two or more first high density sub-layers, wherein said multiple sub-layers comprise at least one sub-layer of a second material and at least one sub-layer of a third material, and wherein said first, second and third materials differ from one another
   wherein the first protective layer protects the active region from damage caused by direct application of the second protective layer.

2. The method of claim 1, wherein said first protective layer is vacuum deposited over a cathode layer in said OLED device.

3. The method of claim 2, wherein a first polymeric sub-layer is vacuum deposited over said first protective layer.

4. The method of claim 3, wherein said polymeric sub-layer comprises a material selected from the group consisting of fluorinated polymers, parylenes, perylenes, cyclotenes and polyacrylates.

5. The method of claim 4, wherein said polymeric sub-layer comprises a polyacrylate.

6. The method of claim 5, wherein said organometallic material comprises copper phthalocyanine.

7. The method of claim 2, wherein said organometallic material is selected from the group consisting of phthalocyanines and porphyrins.

8. The method of claim 7, wherein said organometallic material comprises copper phthalocyanine.

9. The method of claim 1, wherein said organometallic material is selected from the group consisting of phthalocyanines and porphyrins.

10. The method of claim 1, wherein said organometallic material is copper phthalocyanine.

11. The method of claim 1, wherein said multiple sub-layers of said second protective layer are vacuum deposited over said first protective layer.

12. The method of claim 1, wherein said alternating series comprises 3 to 7 first polymeric sub-layers and 3 to 7 first high-density sub-layers.

13. The method of claim 1, wherein said second material comprises a polymer selected from fluorinated polymers, parylenes, perylenes, cyclotenes and polyacrylates.

14. The method of claim 1, wherein said second material comprises a polyacrylate.

15. The method of claim 1, wherein said third material comprises a metal, a metal oxide, a metal nitride, a metal carbide or a metal oxynitride.

* * * * *

UNITED STATES PATENT AND TRADEMARK OFFICE
CERTIFICATE OF CORRECTION

PATENT NO. : 7,002,294 B2  Page 1 of 1
APPLICATION NO. : 10/863182
DATED : February 21, 2006
INVENTOR(S) : Stephen Forrest et al.

It is certified that error appears in the above-identified patent and that said Letters Patent is hereby corrected as shown below:

Col. 3, line 14, after last word "layer", insert -- . --.

Col. 4, line 22, after "example,", delete "a".

Col. 4, line 33, after "120,", change "light emitting" to -- light-emitting --

Col. 4, line 66, change first words "light emitting" to -- light-emitting --

Col. 5, line 2, after "the", change "light emitting" to -- light-emitting --.

Col. 5, line 48, after "flexible", insert -- , --.

Col. 6, line 9, after "materials", change "use" to -- useful --.

Col 6, line 20, after "and", change "contacting" to -- contact --.

Col. 7, line 20, after "glass", insert -- , --.

Col. 8, line 39, after "by", delete "a".

Col. 10, line 2, after "500", change "521" to -- Å --.

Col. 10, line 32, change first word "tested", to -- testing --.

Claim 1, Col. 11, line 28, after last word "another", insert -- , --.

Signed and Sealed this

Third Day of October, 2006

JON W. DUDAS
*Director of the United States Patent and Trademark Office*